United States Patent
Liao et al.

(10) Patent No.: US 11,089,692 B2
(45) Date of Patent: Aug. 10, 2021

(54) CATALYTIC INK COMPRISING METALLIC MATERIAL MADE FROM DIAMMINESILVER HYDROXIDE, AND USES THEREOF

(71) Applicant: TAIWAN GREEN POINT ENTERPRISES CO. LTD., Taichung (TW)

(72) Inventors: Pen-Yi Liao, Taichung (TW); Hui-Ching Chuang, Taichung (TW); Wen-Chia Tsai, Taichung (TW); Jing-Yi Yang, Taichung (TW)

(73) Assignee: Taiwan Green Point Enterprises Co., Ltd., Taichung (TW)

( * ) Notice: Subject to any disclaimer, the term of this patent is extended or adjusted under 35 U.S.C. 154(b) by 160 days.

(21) Appl. No.: 16/183,106

(22) Filed: Nov. 7, 2018

(65) Prior Publication Data

US 2019/0075659 A1    Mar. 7, 2019

Related U.S. Application Data

(62) Division of application No. 15/088,746, filed on Apr. 1, 2016, now Pat. No. 10,154,596.

(30) Foreign Application Priority Data

Apr. 2, 2015    (TW) .................. 104110917

(51) Int. Cl.
| | |
|---|---|
| *B32B 5/16* | (2006.01) |
| *H05K 3/18* | (2006.01) |
| *C09D 11/03* | (2014.01) |
| *C09D 11/10* | (2014.01) |
| *B01J 27/24* | (2006.01) |
| *B01J 35/02* | (2006.01) |

(52) U.S. Cl.
CPC ............... *H05K 3/18* (2013.01); *B01J 27/24* (2013.01); *B01J 35/02* (2013.01); *C09D 11/03* (2013.01); *C09D 11/10* (2013.01); *H05K 3/182* (2013.01); *H05K 2203/0709* (2013.01); *H05K 2203/1157* (2013.01)

(58) Field of Classification Search
CPC .......... B01J 35/004; B01J 23/40; H01M 4/90; H01M 4/9016; H01M 4/9033; H01M 4/9075
See application file for complete search history.

(56) References Cited

U.S. PATENT DOCUMENTS

| | | | |
|---|---|---|---|
| 5,334,782 A | 8/1994 | Morikawa | |
| 5,883,038 A | 3/1999 | Park | |
| 7,255,782 B2 | 8/2007 | Crouse | |
| 10,154,596 B2 * | 12/2018 | Liao | ................. B01J 27/24 |
| 2005/0241949 A1 * | 11/2005 | Crouse | ............... C23C 18/1658 |
| | | | 205/118 |
| 2008/0206616 A1 * | 8/2008 | Atanassova | .......... H01M 4/8642 |
| | | | 429/479 |
| 2009/0202887 A1 * | 8/2009 | Eguchi | .................. H01M 4/90 |
| | | | 429/524 |
| 2010/0021652 A1 | 1/2010 | Lin et al. | |
| 2013/0202713 A1 | 8/2013 | Bele | |
| 2016/0289469 A1 * | 10/2016 | Liao | ................. B01J 35/02 |

FOREIGN PATENT DOCUMENTS

| | | | | |
|---|---|---|---|---|
| CN | 101640979 A | 2/2010 | | |
| CN | 1946880 B | 6/2011 | | |
| WO | WO-0130492 A1 * | 5/2001 | ............... | C25C 1/20 |

OTHER PUBLICATIONS

Kin et al., Carbon supported Ag nanoparticles as high performance cathode catalyst for H2/O2 anion exchange memberane fuel cell, Frontiers in Chemistry, vol. 1, Article 16, Sep. 2003 (Year: 2003).
Muzamil et al., Synthesis of silver nanoparticles by silver salt reduction and its characterization, IOP Publishing; Materials Science and Engineering, 60 (2014) 012034 (Year: 2014).

* cited by examiner

*Primary Examiner* — Hoa (Holly) Le
(74) *Attorney, Agent, or Firm* — Young Basile Hanlon & MacFarlane, P.C.

(57) ABSTRACT

A catalyst for a catalytic ink includes a support particle and a metallic material supported on the support particle. The metallic material is diamminesilver hydroxide, a silver salt, a palladium salt, a gold salt, chloroauric acid, or combinations thereof. A catalytic ink obtained from the catalyst and use of the same to fabricate a conductive circuit are also disclosed.

9 Claims, No Drawings

CATALYTIC INK COMPRISING METALLIC MATERIAL MADE FROM DIAMMINESILVER HYDROXIDE, AND USES THEREOF

CROSS-REFERENCE TO RELATED APPLICATION

This application is a Divisional of U.S. patent application Ser. No. 15/088,746 filed Apr. 1, 2016, which claims priority of Taiwanese Patent Application No. 104110917, filed on Apr. 2, 2015, which are incorporated by reference as if fully set forth.

FIELD

Embodiments of the present disclosure generally relate to a catalyst, and more particularly to a catalyst for a catalytic ink and uses thereof.

BACKGROUND

With technology advances, various electronic products are widely used nowadays. Conductive circuits are important elements for the electronic products, and hence a method for fabricating conductive circuits of the electronic products is continuously being developed and improved.

In recent years, the application of ink printing techniques to manufacture a conductive circuit has caught much attention. CN 1946880 B discloses a method of providing a pattern of a metal on a non-conductive substrate by virtue of ink printing techniques. The method includes the steps of applying a catalytic ink having a source of catalytic metal ions (such as palladium ions and gold ions) in a desired pattern on a surface of the non-conductive substrate; reducing the source of catalytic metal ions to its associated metal with a suitable reducing agent; depositing an electroless metal layer on the pattern of catalytic ink; and plating an electrolytic metal on the electroless metal layer to produce the desired pattern of metal on the substrate.

CN 101640979 A discloses another method of manufacturing a conductive circuit using ink printing techniques. The method disclosed therein includes the steps of printing a catalytic ink containing silver salt solution (such as a silver nitrate solution, a silver sulfate solution, and a silver acetate solution) to form a circuit pattern on a substrate; irradiating the circuit pattern to reduce silver ions contained in the silver salt solution to silver metals, thereby forming a circuit precursor; and plating a conductive metal layer on the circuit precursor to obtain the conductive circuit.

However, the metal ions (such as palladium, silver and gold ions, etc.) in the solution (i.e., in the liquid state) are usually unstable, and tend to undergo undesired reactions. Moreover, if the metal ions are in a non-liquid state or exposed to high temperatures, the reactivity thereof would be greatly reduced. Given this, the metal ions included in the catalytic ink as disclosed in the aforesaid prior art, when applied onto the substrate, must be immediately reduced into a catalytic metal in order to avoid occurrence of the aforesaid undesired reaction or reduced reactivity of the metal ions.

Therefore, the applicants have endeavored to develop a catalyst including catalytic metal ions that are stable and do not require conducting of a reduction reaction immediately when applied onto a substrate.

SUMMARY

Therefore, an object of the disclosure is to provide a catalyst for a catalytic ink that may alleviate at least one of the drawbacks of the prior art.

According to the disclosure, the catalyst includes a support particle and a metallic material supported on the support particle. The metallic material may be selected from the group consisting of diamminesilver hydroxide, a silver salt, a palladium salt, a gold salt, chloroauric acid, and combinations thereof.

A second object of the present disclosure is to provide a catalytic ink including the aforesaid catalyst, a resin and a solvent.

A third object of the present disclosure is to provide a method for manufacturing the aforesaid catalytic ink. According to the disclosure, the method may include the steps of: mixing the support particle and a solution of the metallic material to form the catalyst; and mixing the catalyst, the resin and the solvent.

A fourth object of the present disclosure is to provide a method for fabricating a conductive circuit. According to the disclosure, the method may include the steps of: printing the aforesaid catalytic ink on a substrate to form an ink layer on the substrate; subjecting the metallic material of the catalyst to a reduction reaction so as to form a catalytic metal; and contacting the catalytic metal of the ink layer with a solution containing conductive metal ions, such that a conductive metal is formed and deposited on the ink layer by reduction of the conductive metal ions using the catalytic metal.

A fifth object of the disclosure is to provide another method for fabricating a conductive circuit. According to the disclosure, the method may include the steps of: forming an ink layer on a substrate, the ink layer including a core-shell type catalyst having a core and a shell layer surrounding the core, the shell layer including a metallic material; subjecting the metallic material of the shell to a reduction reaction so as to form a catalytic metal; contacting the catalytic metal of the ink layer with a solution containing conductive metal ions, such that a conductive metal is formed and deposited on the ink layer by reduction of the metallic material using the catalytic metal.

DETAILED DESCRIPTION

An embodiment of a catalyst of this disclosure includes a support particle and a metallic material supported on the support particle. In certain embodiments, the catalyst includes a plurality of the support particles on each of which the metallic material is supported. The metallic material may be diamminesilver hydroxide, a silver salt, a palladium salt, a gold salt, chloroauric acid, or combinations thereof.

The silver salt may be silver nitrate, silver carbonate, silver sulfate, or combinations thereof. The palladium salt may be palladium chloride, palladium acetate, or the combination thereof. In certain embodiments, the metallic material is diamminesilver hydroxide.

In certain embodiments, the metallic material includes catalytic ions supported on the support particle. The catalytic ions may be silver complex ions, silver ions, palladium complex ions, palladium ions, gold complex ions, or combinations thereof.

In certain embodiments, the catalytic ions may be diamminesilver complex ions, $Ag^+$, $[AgCN_2]^{2-}$, $[AgCO_2]^+$, $[AgS_2O_3]^{3-}$, $PdCl_4^{2-}$, $Pd^{2+}$, $[Au(CN)_2]^-$, $AuCl_4^-$, or combinations thereof.

In certain embodiments, the support particle has a diameter not greater than 250 nm. When the support particle has a diameter greater than 250 nm, in a given volume of the catalyst which is composed of a plurality of the support particles, the total surface area of the support particles would be smaller than that having the diameter less than 250 nm. In other words, the surface area of the support particles to be attached by the metallic material would be reduced. When the catalyst is composed of a plurality of the support particles having a diameter less than 220 nm, the support particles are likely to be aggregated together and are difficult to be well dispersed. Therefore, in certain embodiments, the diameter of the support particle ranges from 220 nm to 250 nm.

In certain embodiments, the support particle may be a titanium dioxide particle, a zinc oxide particle, an aluminum oxide particle, a cerium(IV) oxide particle, a lanthanum oxide particle, a barium sulfate particle, a magnesium silicate particle, a carbon particle, or combinations thereof. In certain embodiments, the support particle is a titanium dioxide particle.

In certain embodiments, the catalyst may have a core-shell structure and include a core and a shell layer. The core includes the support particle, and the shell layer includes the metallic material.

Since the metallic material is supported on the support particle, the metallic material is relatively stable. In other words, the catalytic metal ions of the metallic material would not undergo an undesired reaction and would not be adversely affected in terms of the catalytic activity.

The disclosure also provides a catalytic ink including the aforesaid catalyst, a resin and a solvent. The resin suitable for use in this disclosure may be a polyurethane resin, an aldehyde resin, a ketone resin, a phenol-formaldehyde resin, an epoxy resin, a silicone resin, a melamine resin, a fatty acid resin, an acrylic resin, or combinations thereof. In certain embodiments, the resin may be the polyurethane resin, the silicone resin, the epoxy resin, the melamine resin, or combinations thereof.

In certain embodiments, the resin in the catalytic ink is in an amount ranging from 1 to 3 parts by weight based on 1 part by weight of the catalyst. In certain embodiments, the resin is in an amount ranging from 1.2 to 2.6 parts by weight based on 1 part by weight of the catalyst.

The solvent suitable for use in this disclosure may be ketone, alcohol, ester, ether, benzene, mineral spirit, or combinations thereof.

Examples of the ketone suitable for use in this disclosure may include cyclohexanone, isophorone, acetone, butanone, N-methyl-2-pyrrolidone, and combinations thereof.

Examples of the alcohol suitable for use in this disclosure may include isopropanol, n-butanol and the combination thereof.

Examples of the ester suitable for use in this disclosure may include ethyl acetate, n-butyl acetate, ethylene glycol monoethyl ether acetate, and combinations thereof.

Examples of the ether suitable for use in this disclosure may include dipropylene glycol methyl ether, ethylene glycol monobutyl ether and the combination thereof.

In certain embodiments, the solvent is N-methyl-2-pyrrolidone or ethylene glycol monobutyl ether.

In certain embodiments, the solvent in the catalytic ink is in an amount ranging from 0.5 to 3 parts by weight based on 1 part by weight of the catalyst. In certain embodiments, the solvent is in an amount ranging from 0.7 to 2.6 parts by weight based on 1 part by weight of the catalyst.

The catalytic ink of the present disclosure may further include an additive. The additive may be a curing agent, a silane coupling agent, a lubricant such as castor oil, a smoothing agent, a dispersing agent, a defoaming agent, a leveling agent, a wetting agent, an anti-blocking agent, or combinations thereof.

In certain embodiments, the additive may be the curing agent, the silane coupling agent or the combination thereof. In certain embodiments, the curing agent in the catalytic ink is in an amount ranging from 0.1 to 0.23 parts by weight based on 1 part by weight of the catalyst. In certain embodiments, the silicone coupling agent in the catalytic ink is in an amount ranging from 0.02 to 0.04 parts by weight based on 1 part by weight of the catalyst.

Examples of the curing agent suitable for use in this disclosure may include methyl benzoate, isocyanate and the combination thereof. In certain embodiments, the curing agent is isocyanate, and the silane coupling agent is aminosilane coupling agent.

This disclosure also provides a method for manufacturing the aforesaid catalytic ink. An embodiment of the method includes the steps of: mixing the support particle and a solution of the metallic material to form the catalyst; and mixing the catalyst, the resin and the solvent.

In certain embodiments, the solution of the metallic material has a concentration ranging from 0.1 N to 0.5 N.

In certain embodiments, the aforesaid additive may be added during the step of mixing the catalyst, the resin and the solvent.

This disclosure further provides a method for fabricating a conductive circuit. An embodiment of the method includes the steps of: printing the aforesaid catalytic ink on a substrate so as to form an ink layer on the substrate; subjecting the metallic material of the catalyst to a reduction reaction so as to reduce the catalytic ions of the metallic material into a catalytic metal; and contacting the catalytic metal of the ink layer with a solution containing conductive metal ions, such that a conductive metal is formed and deposited on the ink layer by reduction of the conductive metal ions using the catalytic metal.

According to the disclosure, since the catalytic ions of the metallic material are supported on the support particle, the metallic material has good stability and is unlikely to undergo undesired non-reduction reactions. The ink layer formed therefrom can be preserved for a long time after being applied on the substrate, and the metallic material included in the ink layer does not require immediate conducting of a reduction reaction. In certain embodiments, the catalytic ions of the metallic material included in the ink layer on a substrate could maintain its ionic form and reactivity for about one month.

The substrate suitable for use in this disclosure may be made from a material e.g., polycarbonate, polyethylene terephthalate, polyamide, poly(methyl methacrylate), an epoxy resin, syndiotactic polystyrene, polyphenylene sulfide, glass, ceramics, acrylonitrile-butadiene-styrene copolymer, and combinations thereof.

In certain embodiments, the step of subjecting the metallic material of the catalyst to the reduction reaction is conducted using a reducing agent. In certain embodiments, the reducing agent is formaldehyde.

In certain embodiments, when the metallic material of the catalyst is diamminesilver hydroxide, the step of subjecting the metallic material of the catalyst to the reduction reaction may be conducted by UV exposure, i.e., the catalytic ions are reduced into the catalytic metal by UV light. In certain embodiments, the UV has a wavelength ranging from 230 nm to 380 nm. In certain embodiments, the wavelength of the UV is 254 nm.

In certain embodiments, the support particle may be a photocatalyst, and the step of subjecting the metallic material of the catalyst to the reduction reaction includes activating the photocatalyst by UV exposure, and reducing the catalytic ions of the metallic material to a catalytic metal using the activated photocatalyst. In certain embodiments, the support particle is titanium dioxide.

According to the disclosure, the conductive metal ions may be copper ions, nickel ions or the combination thereof.

In certain embodiments, the method for fabricating the conductive circuit of the disclosure may further include a step of patterning the conductive metal formed on the ink layer so as to form the conductive circuit. The step may be performed by wet-etching techniques or laser ablation, but is not limited thereto.

The disclosure will be further described by way of the following examples. However, it should be understood that the following examples are solely intended for the purpose of illustration and should not be construed as limiting the disclosure in practice.

EXAMPLES

The sources of the chemicals used in the following examples are listed in Table 1.

TABLE 1

|  | Chemical | Source |
| --- | --- | --- |
| Support particle | titanium dioxide | 1 |
| Metallic material | silver nitrate (aq) | 2 |
| (diamminesilver hydroxide) | ammonia (aq) | 1 |
| Resin | polyurethane resin | 1 |
|  | silicone resin | 1 |
|  | epoxy resin | 3 |
|  | melamine resin | 4 |
| Solvent | N-methyl-2-pyrrolidone | 1 |
|  | ethylene glycol monobutyl ether | 1 |
| Curing agent | isocyanate | 1 |
| Coupling agent | aminosilane coupling agent | 1 |
| Conductive metal ion solution | Copper plating solution | 5 |

1: Jia Wang Chemical Industry Co.
2: Camco Enterprises Co., Ltd.
3: Ezbond Chemical Co., Ltd.
4: An Fong Development Co., Ltd.
5: MacDermid Chemical Taiwan Ltd.

Preparation of a Catalyst

Preparative Example 1

0.1 N aqueous solution of silver nitrate was added to 25 wt % of aqueous ammonia. When the resulting solution became clear, a solution of diamminesilver hydroxide (0.1 N) was obtained.

The titanium dioxide particles having a diameter of 250 nm and the solution of diamminesilver hydroxide were mixed at a weight ratio of 2.65:1 so as to produce a catalyst. The resultant catalyst has a core-shell structure, and includes a core of titanium dioxide and a shell layer of diamminesilver hydroxide.

Preparation of a Catalytic Ink

Example 1 (E1)

Polyurethane resin (24 g) and the catalyst of Preparative Example 1 (25.8 g) were placed in an agitator (Shin Kwang Machinery Industry Co., Ltd.; Model No. G-100R) and stirred at 800 rpm for 300 seconds so as to obtain a first mixture.

Silicone resin (19.5 g), epoxy resin (9 g) and N-methyl-2-pyrrolidone (2.8 g) were sequentially added to the first mixture at an agitation speed of 800 rpm for 300 seconds so as to obtain a second mixture.

Isocyanate (3 g) was added to the second mixture and then stirred at 800 rpm for 60 seconds so as to obtain a third mixture.

N-methyl-2-pyrrolidone (21.2 g) was added to the third mixture in the agitator and then stirred at 300 rpm for 20 minutes with the agitator being covered so as to obtain the catalytic ink.

Example 2 (E2)

Polyurethane resin (24 g) and the catalyst of Preparative Example 1 (16 g) were placed in an agitator and stirred at 800 rpm for 300 seconds so as to obtain a first mixture.

Melamine resin (0.4 g) and ethylene glycol monobutyl ether (8 g) were sequentially added to the first mixture at an agitation speed of 800 rpm for 300 seconds so as to obtain a second mixture.

Isocyanate (3.6 g) was added to the second mixture and then stirred at 800 rpm for 60 seconds so as to obtain a third mixture.

Ethylene glycol monobutyl ether (32 g) was added to the third mixture in the agitator and then stirred at 300 rpm for 20 minutes with the agitator being covered so as to obtain the catalytic ink.

Example 3 (E3)

Polyurethane resin (19.2 g) and the catalyst of Preparative Example 1 (17.1 g) were placed in an agitator and stirred at 800 rpm for 300 seconds so as to obtain a first mixture.

Isocyanate (3 g) was added to the first mixture at an agitation speed of 800 rpm for 60 seconds so as to obtain a second mixture.

Silicone resin (3 g) was added to the second mixture and then stirred at 800 rpm for 300 seconds so as to obtain a third mixture.

Ethylene glycol monobutyl ether (19.2 g) was added to the third mixture in the agitator and then stirred at 300 rpm for 20 minutes with the agitator being covered so as to obtain the catalytic ink.

Example 4 (E4)

Polyurethane resin (30 g) and the catalyst of Preparative Example 1 (13.5 g) were placed in an agitator and stirred at 800 rpm for 300 seconds so as to obtain a first mixture.

Melamine resin (1 g), silicone resin (3 g) and epoxy resin (1 g) were sequentially added to the first mixture at an agitation speed of 800 rpm for 300 seconds so as to obtain a second mixture.

Isocyanate (2.25 g) was added to the second mixture and then stirred at 800 rpm for 60 seconds so as to obtain a third mixture.

An aminosilane coupling agent was added to the third mixture and then stirred at 800 rpm for 300 seconds so as to obtain a fourth mixture.

Ethylene glycol monobutyl ether (10 g) was added to the fourth mixture in the agitator and then stirred at 300 rpm for 20 minutes with the agitator being covered so as to obtain the catalyst.

Each component and the content thereof (based on 1 part by weight of the catalyst) used in the preparation of the catalytic inks of Examples 1-4 are respectively summarized in Table 2.

TABLE 2

| Component | | Content (part by weight) | | | |
|---|---|---|---|---|---|
| | | E1 | E2 | E3 | E4 |
| Resin | polyurethane resin | 0.930 | 1.500 | 1.123 | 2.222 |
| | silicone resin | 0.756 | — | 0.175 | 0.222 |
| | epoxy resin | 0.349 | — | — | 0.074 |
| | melamine resin | — | 0.025 | — | 0.074 |
| Solvent | N-methyl-2-pyrrolidone | 0.930 | — | — | — |
| | Ethylene glycol monobutyl ether | — | 2.500 | 1.123 | 0.740 |
| Curing agent | isocyanate | 0.116 | 0.225 | 0.175 | 0.167 |
| Coupling agent | aminosilane coupling agent | — | — | — | 0.033 |

Preparation of a conductive circuit

Application Examples 1-4 (AE1-4)

The conductive circuits of Application Examples 1-4 were prepared by a method as described below and respectively using the catalytic inks of Examples 1-4. The substrates used in AE1 to AE4 are listed in Table 3.

TABLE 3

| | Substrate |
|---|---|
| AE1 | polyethylene terephthalate substrate |
| AE2 | poly(methyl methacrylate) substrate |
| AE3 | glass substrate |
| AE4 | epoxy resin substrate |

The catalytic ink of each of Examples 1-4 was printed onto the substrate to form an ink layer thereon. It should be noted that since the metallic material of the catalyst included in the ink layer is relatively stable and does not tend to undergo undesired reactions, the ink layer formed on the substrate can be preserved for a long time, and does not need the following step to be conducted immediately. The ink layer of AE1 to AE4 can be preserved for one month.

The ink layer on the substrate was irradiated by deuterium lamp with a wavelength of 254 nm for 5 to 8 minutes so as to activate the titanium dioxide particles. The activated titanium dioxide particles which serve as the photocatalyst are capable of reducing the diamminesilver hydroxide of the catalyst to form silver metals (i.e., catalytic metals).

The resulting ink layer as well as the substrate was immersed in a copper plating solution having the components as shown in Table 4 for 15 minutes, such that a layer of copper metals (conductive metals) was formed and deposited on the ink layer by reduction of the cooper ions using the silver metals. It is noted that the time for immersing the ink layer in the copper plating solution may vary depending on the desired thickness of the layer of copper metal to be formed on the substrate.

TABLE 4

| Component | Content (g/L) |
|---|---|
| Formaldehyde | 2.2 |
| Sodium hydroxide | 4.2 |
| Copper ion | 2 |
| Ethylenediaminetetraacetic acid (EDTA) | 0.13 |

The layer of copper metal was then etched by 3-Axis fiber laser (KEYENCE Taiwan Co., Ltd.; Model No. MD-5100) with a wavelength of 1090 nm to remove an unwanted portion of copper metal so as to form the conductive circuit.

In summary, by supporting the metallic material on the support particle, the catalytic ions of the metallic material become stable. Thus, the catalytic ink made therefrom can be preserved for a long time when printing on the substrate and does not require a reduction reaction to be conducted immediately to transform catalytic ions into the catalytic metals.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A catalytic ink, comprising:
    a catalyst having a support particle and a metallic material supported on said support particle, said support particle being selected from the group consisting of titanium dioxide particle, zinc oxide particle, aluminum oxide particle, cerium(IV) oxide particle, lanthanum oxide particle, barium sulfate particle, magnesium silicate particle, carbon particle, and combinations thereof, said metallic material being made of diamminesilver hydroxide;
    a resin; and
    a solvent.

2. The catalyst ink of claim 1, wherein said catalyst has a core-shell structure and includes a core and a shell layer, said core including said support particle, said shell layer including said metallic material.

3. The catalytic ink of claim 1, wherein, based on 1 part by weight of said catalyst, said resin is in an amount ranging from 1 to 3 parts by weight, and said solvent is in an amount ranging from 0.5 to 3 parts by weight.

4. The catalytic ink of claim 1, wherein said solvent is selected from the group consisting of ketone, alcohol, ester, ether, benzene, mineral spirit, and combinations thereof.

5. A method for manufacturing the catalytic ink of claim 1, comprising the steps of:
   mixing the support particle and a solution of the metallic material to form the catalyst; and
   mixing the catalyst, the resin and the solvent.

6. The method of claim 5, wherein the support particle is added in an amount ranging from 2 to 3 parts by weight based on 1 part by weight of the solution of metallic material.

7. A method for fabricating a conductive circuit, comprising the steps of:
   printing the catalytic ink of claim 1 on a substrate so as to form an ink layer on the substrate;
   subjecting the metallic material of the catalyst to a reduction reaction so as to form a catalytic metal; and
   contacting the catalytic metal of the ink layer with a solution containing conductive metal ions, such that a conductive metal is formed and deposited on the ink layer by reduction of the conductive metal ions using the catalytic metal.

8. The method of claim 7, wherein the step of subjecting the metallic material of the catalyst to the reduction reaction is conducted by UV exposure.

9. The method of claim 8, wherein the metallic material is diamminesilver hydroxide.

* * * * *